United States Patent [19]

Rodi et al.

[11] Patent Number: 4,659,349

[45] Date of Patent: Apr. 21, 1987

[54] FILTER UNIT ON EQUIPMENT REQUIRING VENTILATION FREE OF DUST AND IMPURITIES DURING OPERATION

[75] Inventors: Anton Rodi, Leimen; Jürgen Reithofer, Nussloch; Peter Blaser, Dielheim, all of Fed. Rep. of Germany

[73] Assignee: Heidelberger Druckmaschinen AG, Heidelberg, Fed. Rep. of Germany

[21] Appl. No.: 747,988

[22] Filed: Jun. 24, 1985

[30] Foreign Application Priority Data

Jun. 22, 1984 [DE] Fed. Rep. of Germany ....... 3423047

[51] Int. Cl.4 .............................................. B01D 50/00
[52] U.S. Cl. ................... 55/385 C; 55/471; 55/DIG. 29; 98/115.3; 361/384
[58] Field of Search ................ 55/320, 325, 326, 471, 55/385 R, 385 A, 496, 385 C, 385 E, 385 F, DIG. 6, DIG. 29; 98/1, 115.3; 355/30; 361/383, 384; 174/16 R

[56] References Cited

U.S. PATENT DOCUMENTS

| 3,364,838 | 1/1968 | Bradley | 174/16 R |
| 3,771,293 | 11/1973 | Vest | 361/384 X |
| 3,807,148 | 4/1974 | Fike et al. | 55/385 R |
| 3,962,608 | 6/1976 | Forster et al. | 361/384 X |
| 4,126,269 | 11/1978 | Bruges | 361/384 X |
| 4,534,776 | 8/1985 | Mammel et al. | 174/16 R X |
| 4,539,896 | 9/1985 | Thomas | 55/DIG. 29 |

Primary Examiner—Charles Hart
Attorney, Agent, or Firm—Herbert L. Lerner; Laurence A. Greenberg

[57] ABSTRACT

A filter device on electrical switch cabinets, housings for electronic systems and like equipment to be maintained free of dust and impurities while being ventilated during operation includes a labyrinth filter disposed in a travel path of ventilating air upstream of an air intake opening of the equipment to be ventilated, the labyrinth filter having means for effecting a plurality of changes in direction of flow of the ventilating air therethrough so as to function in a manner similar to that of a mechanical labyrinth seal.

6 Claims, 3 Drawing Figures

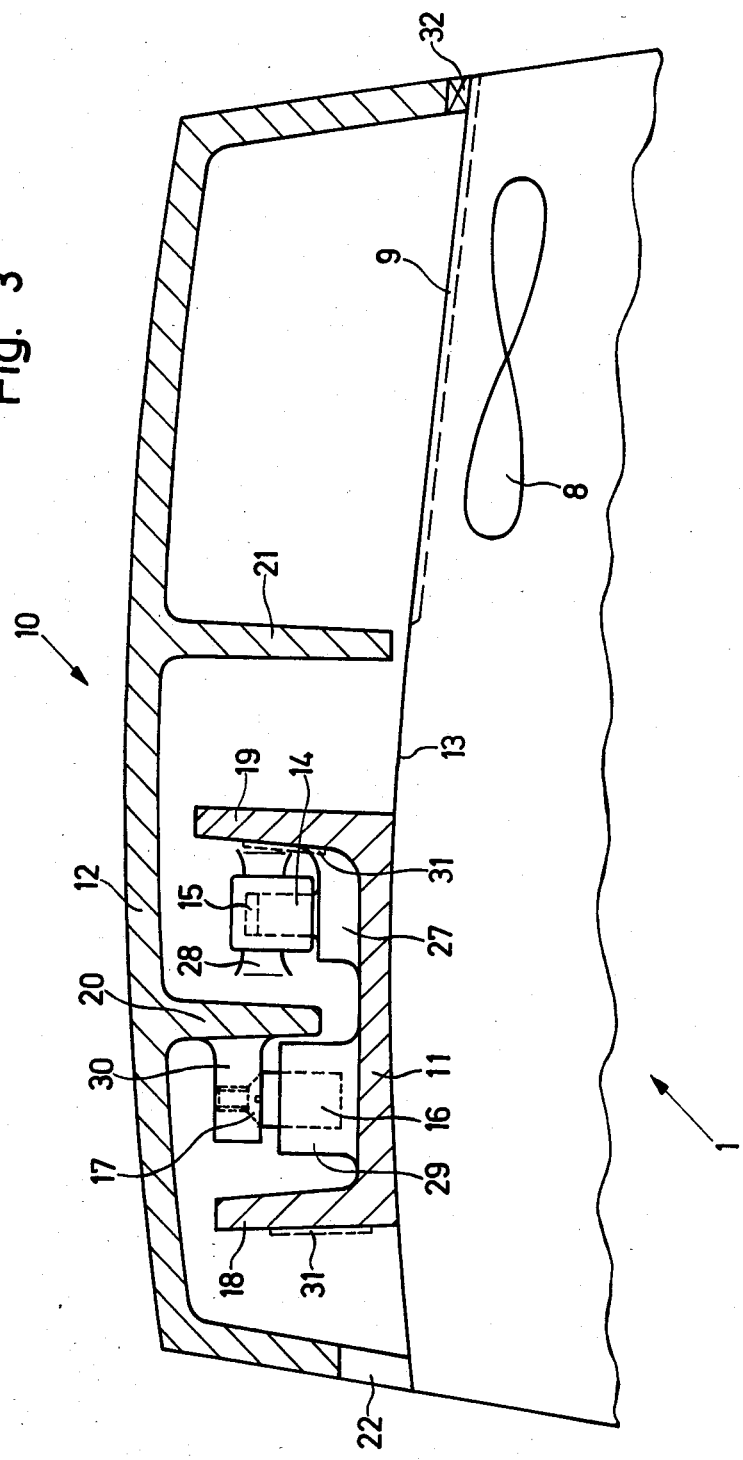

FILTER UNIT ON EQUIPMENT REQUIRING VENTILATION FREE OF DUST AND IMPURITIES DURING OPERATION

The invention relates to a filter unit on electric switch cabinets, electronic housings or similar equipment, requiring ventilation free of dust and other impurities during operation.

As is generally known, due to internal power losses and other factors, the aforementioned types of equipment are often subject to a varying degree of heat generation during operation. As a rule, however, the integrated components are exceptionally temperature sensitive, so that cooling is an absolute necessity.

This cooling is effected, for the most part by ventilation of the interior of the equipment by means of one or more blowers. Because the sucked-in cooling air always carries or entrains dust or similar impurities, leakage currents or similar interferences which impair the operation of the equipment can result, for example, from conductive particles contained therein.

For this reason, filters are often provided in the vicinity of the air intake or inlet opening of the equipment in order to filter the impurities out of the air, thereby keeping them away from the electronic components. These filters, mostly in the form of filter mats or filter rolls, feature a fine-mesh woven fabric through which the air must pass, thereby cleaning it.

This type of cooling air filtration has serious disadvantages. Thus, the ventilation must be constantly monitored because clogging of the filter with dirt particles could lead to failure of the ventilation, resulting in the destruction of the temperature sensitive components of the equipment due to overheating. Continuous filter changing is therefore absolutely necessary. In addition, the use of an extremely fine-mesh woven fabric considerably increases the required blower power.

The aforementioned effects or influences are all the more disruptive, the more sensitive the components are, that is, especially in the case of equipment provided with microelectronic components such as electronic memories, personal computers, and the like.

It is accordingly an object of this invention to provide a filter unit of the foregoing general type which is extremely easy to service i. e. service-friendly, and is capable of functioning without impairment even in the case of excessive dirt accumulation in the filter, thereby excluding the possibility of overheating and destruction of the electronic components.

With the foregoing and other objects in view, there is provided, in accordance with the invention, a filter device on electrical switch cabinets, housings for electronic systems and like equipment to be maintained free of dust and impurities while being ventilated during operation, comprising a labyrinth filter disposed in a travel path of ventilating air upstream of an air intake opening of the equipment to be ventilated, the labyrinth filter having means for effecting a plurality of changes in direction of flow of the ventilating air therethrough so as to function in a manner similar to that of a mechanical labyrinth seal.

In accordance with an added feature of the invention, the labyrinth filter is of bipartite construction and comprises interlocking lower and upper parts formed with comb-type segments.

In accordance with an additional feature of the invention, the lower and upper parts are constructed with opposing segments having a selected spacing, number and steepness for attaining a filter effect matching the extent to which the ventilating air has dust and impurities therein.

In accordance with another feature of the invention, there is provided at least one dirt collector installed in the labyrinth filter in accordance with the medium being filtered and depending upon the type of impurities to be filtered out, respectively.

In accordance with a further feature of the invention, the dirt collector is an electrostatic dirt collector.

The filter device according to the invention provides considerable advantages over the conventional devices of this general type. The large air inlet cross section of the hereinafter described embodiment thus always ensures a sufficient supply of cooling air. Soiling of the labyrinth filter can, at the most lead to soiling of the equipment components and not to their overheating, so that continuous inspection of the filter unit is therefore unnecessary. It is also unnecessary to renew filter material. Furthermore, the additional power consumption of the blower is considerably lower than is the case when using conventional filter devices.

In an especially advantageous embodiment of the filter device which is constructed in the form of an attachment for a personal computer, the labyrinth filter comprises a lower section or part bonded to the personal computer and an upper section or part which is positioned on the lower part, both parts having segments which extend over the entire width of the computer and mesh with one another. An air vortex occurs at edges of the segments, causing dirt particles to be deposited inside the filter. Filter maintenance is extremely simple, because only the top part of the labyrinth filter need be taken off so that the deposits can be removed by means of a brush. The shape of the labyrinth filter is suitably matched with the shape of the housing of the personal computer.

In accordance with again another feature of the invention, there are provided corresponding lugs and bores formed in webs as well as press-fitted magnetic inserts with metallic counter members cooperating therewith carried by the upper and the lower parts of the labyrinth filter for forming an exact-fit and quick-release connection of the upper and the lower parts.

In accordance with a concomitant feature of the invention, a surrounding sealing strip is disposed between the upper part of the labyrinth filter and the top of the personal computer Other features which are considered as characteristic for the invention are set forth in the appended claims.

Although the invention is illustrated and described herein as embodied in a filter unit on equipment requiring ventilation free of dust and impurities during operation, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings, in which:

FIG. 3 is an enlarged cross-sectional view of FIG. 2 taken along the line 3—3 in direction of the arrows.

Figure 1:
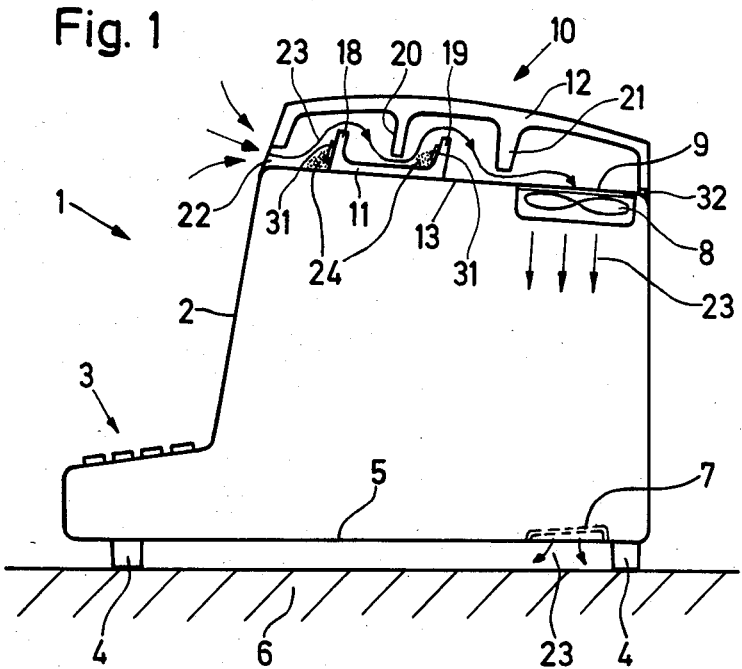
FIG. 1 is a diagrammatic cross-sectional view of FIG. 2 taken along the line 1—1 in direction of the arrows and showing a personal computer with a labyrinth filter unit constructed in accordance with the invention.
Figure 2:
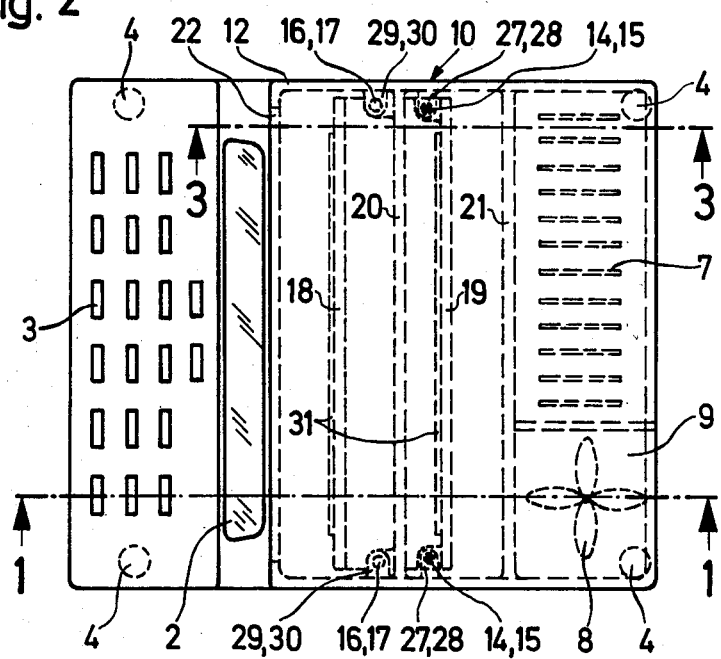
FIG. 2 is a top plan view of the filter unit.

Referring now to the drawing and first, particularly, to FIG. 1 thereof, there is shown a personal computer 1, for example, with a cathode-ray tube (CRT) display. Data is acquired and processed by means of a viewing screen or display 2 as well as a keyboard 3. By means of feet 4, respectively, arranged at the corners, a given spacing between the underside 5 of the computer 1 and a base or supporting surface 6 is ensured. Air outlet slots 7, through which cooling air 23 sucked in by a blower 8 can again be returned to the outside, can furthermore be located at the underside 5 of the personal computer 1.

The blower 8 together with a corresponding intake opening 9 of the personal computer 1 are located in the upper region thereof. Static overpressure is thereby generated within the personal computer during ventilation so that no air and therefore no dirt can enter through any slots or small openings that may be formed in the outer walls of the computer 1, however, small quantities of the cooling air 23 supplied by the blower 8 are forced outwardly.

A filter unit according to the invention for cleaning the drawn-in cooling air 23 is located on the top 13 of the personal computer 1 and disposed in the travel path of the cooling air 23 upstream of or before the blower 8. An important element, namely a labyrinth filter 10 is formed of a lower section 11 and an upper section 12 above it, the latter being matched to the shape of the personal computer housing 1 by suitable design of the outer contour thereof. In a preferred embodiment, the lower section 11 is bonded or secured by adhesive to the top 13 of the personal computer and is then covered by the upper section 12. As shown in FIG. 3, an exact fit and a firm, yet fast-release connection between the lower and upper sections 11 and 12 is established by means of lugs 14 with corresponding bores 15 arranged on corresponding webs 27, 28, 29 and 30 on the left and right-hand sides of the lower and upper sections 11, 12 and by means of press-fitted magnetic inserts 16 with mating and cooperating metal counterpieces such as screws 17. Comb-type segments 18 and 19 of the lower section 11 and segments 20 and 21 of the upper section 12 which are arranged vertically, as viewed in FIG. 3, for example, disposed opposite one another and which, respectively, extend over the entire width of the personal computer 1, provide the required labyrinth filter effect. The cooling air 23 which is sucked-in via an intake slot 22 in the upper section 12 is consequently subjected to or forced into continuous changes in its direction of flow before entering into the interior of the personal computer 1, whereby vortices are produced, respectively, at the edges of the segments 18 to 21 and dirt particularly or dust 24 are thereby deposited inside the labyrinth filter 10. Due to the preferred vertical arrangement of the segments 18 to 21, dust is deposited due to the force of gravity, at preferred locations which do not impair ventilation. Depending upon the medium to be filtered and the type of impurities to be filtered out, respectively, it would be possible, for example, to install electrostatic dirt collectors 31 or the like in the labyrinth filter 10 and to attach them to the respective segments 18, 19 of the lower section 11 as indicated, for example, by the dotted lines in the figures.

A surrounding sealing strip 32 between the upper section 12 and the top 13 of the personal computer 1 prevents the entry of secondary air.

As mentioned hereinbefore, the invention is not restricted to the embodiment specifically shown and described but rather, it is possible to adapt the filter effect to whatever conditions are given, such as the degree of air contamination, for example, by suitably selecting the spacing number and inclination or steepness of the segments. Other constructive extensions are also feasible which comply with or are based upon the aforedescribed principle.

The foregoing is a description corresponding in substance to German Application No. P 34 23 047.5, dated June 22, 1984, the International priority of which is being claimed for the instant application, and which is hereby made part of this application. Any material discrepancies between the foregoing specification and the aforementioned corresponding German application are to be resolved in favor of the latter.

We claim:

1. Filter device on electrical switch cabinets, housings for electronic systems and like equipment to be maintained free of dust and impurities while being ventilated during operation, comprising a labyrinth filter disposed in a travel path of ventilating air upstream of an air intake opening of the equipment to be ventilated, said labyrinth filter having means for effecting a plurality of sharp changes in direction of flow of the ventilating air therethrough so as to function in a manner similar to that of a mechanical labyrinth seal, said labyrinth filter being of bipartite construction and comprising interlocking lower and upper parts formed with comb-type segments for blocking particles in the ventilating air flow and depositing the particles under the influence of gravity in lower regions of said lower parts, said labyrinth filter being constructed as an attachment for a personal computer, said lower part of said labyrinth filter being secured by adhesive to an upper side of the personal computer, and said upper part of said labyringh filter being superimposed on said lower part thereof and being matched by suitable shaping of outer contours thereof to the shape of the housing of the personal computer, and including corresponding lugs and bores formed in webs as well as press-fitted magnetic inserts with metallic counter members cooperating therewith carried by said upper and said lower parts of said labyrinth filter for forming an exact-fit and quick-release connection of said upper and said lower parts.

2. Filter device according to claim 1 wherein said lower and upper parts are constructed with opposing segments having a selected spacing, number and steepness for attaining a filter effect matching the extent to which the ventilating air has dust and impurities therein.

3. Filter device according to claim 1 including at least one dirt collector installed in said labyrinth filter in accordance with the medium being filtered and depending upon the type of impurities to be filtered out, respectively.

4. Filter device according to claim 3, wherein said dirt collector is an electrostatic dirt collector.

5. Filter device according to claim 1 wherein said segments of said upper and lower parts of said labyrinth filter are disposed vertically and extend across the width of the personal computer.

6. Filter device according to claim 1 wherein a surrounding sealing strip is disposed between said upper part of said labyrinth filter and the top of the personal computer.

* * * * *